(12) United States Patent
Uchida et al.

(10) Patent No.: US 6,335,483 B1
(45) Date of Patent: Jan. 1, 2002

(54) NOISE-SUPPRESSING COMPONENT

(75) Inventors: Katsuyuki Uchida, Hikone; Masami Sugitani, Omihachiman, both of (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/122,750

(22) Filed: Jul. 27, 1998

(30) Foreign Application Priority Data

Jul. 29, 1997 (JP) .................................................. 9-202753

(51) Int. Cl.⁷ .................................................. H01B 11/06
(52) U.S. Cl. .................................. 174/36; 333/12; 336/92
(58) Field of Search .................................. 174/36, 105 R, 174/106 R; 333/12, 243; 336/175, 90, 92

(56) References Cited

U.S. PATENT DOCUMENTS

| | | | |
|---|---|---|---|
| 2,508,479 A | * | 5/1950 | Wheeler ...................... 333/12 X |
| 3,316,344 A | * | 4/1967 | Kidd et al. ................ 174/106 R |
| 4,656,451 A | * | 4/1987 | Pomponio ................... 333/12 X |
| 4,699,743 A | * | 10/1987 | Nakamura et al. ............ 264/104 |
| 4,843,356 A | * | 6/1989 | Lusignan et al. ........... 174/36 X |
| 5,200,730 A | * | 4/1993 | Masuda et al. ............ 333/12 X |
| 5,323,160 A | * | 6/1994 | Kim et al. .................... 342/1 |
| 5,629,661 A | * | 5/1997 | Ooi et al. ..................... 336/198 |
| 5,763,825 A | * | 6/1998 | Gilliland ......................... 174/36 |
| 5,990,756 A | * | 11/1999 | France, Jr. et al. ............. 333/12 |

FOREIGN PATENT DOCUMENTS

| | | |
|---|---|---|
| DE | 3941915 | 7/1990 |
| GB | 2 134 128 | 8/1984 |
| JP | 59-189609 | 10/1984 |
| JP | 2-181351 | 7/1990 |
| JP | 3-62607 | 3/1991 |
| JP | 3-78984 | * 4/1991 |
| JP | 3-150815 | 6/1991 |
| JP | 4-318906 | 11/1992 |
| JP | 7-106141 | 4/1995 |
| JP | 8-111335 | 4/1996 |

OTHER PUBLICATIONS

Patent Abstracts of Japan, vol. 009, No. 332 (E–370), Dec. 26, 1985, Japanese Application No. 60–163411 A.

* cited by examiner

*Primary Examiner*—Chau N. Nguyen
(74) *Attorney, Agent, or Firm*—Burns, Doane, Swecker & Mathis, LLP

(57) ABSTRACT

A noise-suppressing component includes a ring-shaped ceramic core and an insulating member with which the surface of the ring-shaped ceramic core is coated having magnetic powder. Ceramic ferrite having an initial magnetic permeability of approximately 50 to 1500, for example, is used for the ring-shaped ceramic core. Resin including magnetic powder having an initial magnetic permeability of approximately 2 to 50 or rubber including the magnetic powder, for example, is used for the insulating member having the magnetic powder. The insulating member having the magnetic powder includes magnetic powder having an average particle diameter of approximately 1 to 1000 μm and has a magnetic-powder content of approximately 20 to 70 percent by volume.

23 Claims, 6 Drawing Sheets

NOISE-SUPPRESSING COMPONENT

This application corresponds to Japanese Patent Application No. 9-202753, filed on Jul. 29, 1997, which is hereby incorporated by reference in its entirety.

BACKGROUND OF THE INVENTION

1. Field of the Invention

The present invention relates to noise-suppressing components, and more particularly, to a noise-suppressing component mounted to a signal line for removing high-frequency noise transmitted through the signal line.

2. Description of the Related Art

A ring-shaped core made from ceramic ferrite has been known as a conventional noise-suppressing component for removing high-frequency noise traveling through a signal line. Ceramic ferrite can have a high magnetic permeability and achieves a great noise-suppressing effect on noise having a frequency of 100 MHz or less. As the initial magnetic permeability of the ceramic ferrite becomes higher, a frequency where the magnetic permeability starts decreasing becomes lower. The magnetic loss of ceramic ferrite also starts attenuating at a relatively low frequency and a required resistance cannot be obtained in some cases at a high frequency exceeding 100 MHz. If the ring-shaped core is made larger in size in order to obtain a required resistance at a high frequency, the resistance at a low frequency also increases and a normal signal waveform is distorted.

As a countermeasure to these problems, a ceramic core having a low magnetic permeability is combined with a ceramic core having a high magnetic permeability to improve the characteristics of the combined device. In a ceramic core having a low magnetic permeability, the magnetic permeability starts decreasing at a high frequency and the magnetic loss also starts increasing at a high frequency. As such, a frequency range in which the magnetic loss increases can be extended by an appropriate combination of a ceramic core having a low magnetic permeability and a ceramic core having a high magnetic permeability.

Since the ring-shaped core in the conventional noise-suppressing component is made from ceramic ferrite only, its characteristics are limited in relation to the Snoek's critical line when a ceramic core having a low magnetic permeability is combined with a ceramic core having a high magnetic permeability. Therefore, a fully satisfactory noise-suppressing effect cannot be expected in the desired frequency band. In addition, since ceramic ferrite has a weak resistance to mechanical stress, a combined ceramic core made from ceramic ferrite only may break.

SUMMARY OF THE INVENTION

Accordingly, it is an object of the present invention to provide a noise-suppressing component which can suppress noise in a wide frequency band ranging from the MHz band to the GHz band and which is resistant to mechanical stress.

The foregoing object is achieved according to the present invention through the provision of a noise-suppressing component including: (a) a ring-shaped ceramic core having an initial magnetic permeability of approximately 50 to 1500 and (b) an insulating member integrally formed with the ring-shaped ceramic core (e.g., to form one unit), which is made from either resin or rubber and which includes magnetic powder having an initial magnetic permeability of approximately 2 to 50. The insulating member having the magnetic powder may be configured such that the magnetic powder has an average particle diameter of approximately 1 to 100 $\mu$m and the insulating member having the magnetic powder has a magnetic-powder content of approximately 20 to 70 percent by volume. The phrase "insulating member having magnetic powder" means that the insulating member is made from either resin or rubber or like material, and includes magnetic powder added thereto. Because of the presence of the powder, which may be conductive, the insulating member as a whole may not necessarily have an insulating effect.

With the above structure, in the insulating member having the magnetic powder, the magnetic loss starts increasing in the high-frequency region. Therefore, the insulating member having the magnetic powder has a resistance increasing only in the high-frequency region due to the magnetic loss.

As will be more readily understood from the following description, according to the present invention, the ring-shaped ceramic core has an initial magnetic permeability of approximately 50 to 1500 and is integrally formed with the insulating member which includes magnetic powder having an initial magnetic permeability of approximately 2 to 50, and accordingly, a reduction in resistance due to a reduction of the magnetic loss of the ring-shaped ceramic core in a high-frequency range is compensated for by the insulating member having the magnetic powder. Further, noise in a wide frequency region ranging from the MHz band to the GHz band which is traveling through a signal line is suppressed. In addition, when the ring-shaped ceramic core is coated with an insulating member which includes magnetic powder formed of flexible resin or flexible rubber, external mechanical stress is unlikely to be applied to the ring-shaped ceramic core, and a noise-suppressing component which is resistant to external mechanical stress is thereby obtained.

BRIEF DESCRIPTION OF THE DRAWINGS

The foregoing and other objects, features and advantages of the present invention will be more readily understood upon reading the following detailed description in conjunction with the drawings in which.

DESCRIPTION OF THE PREFERRED EMBODIMENTS

Figure 1:
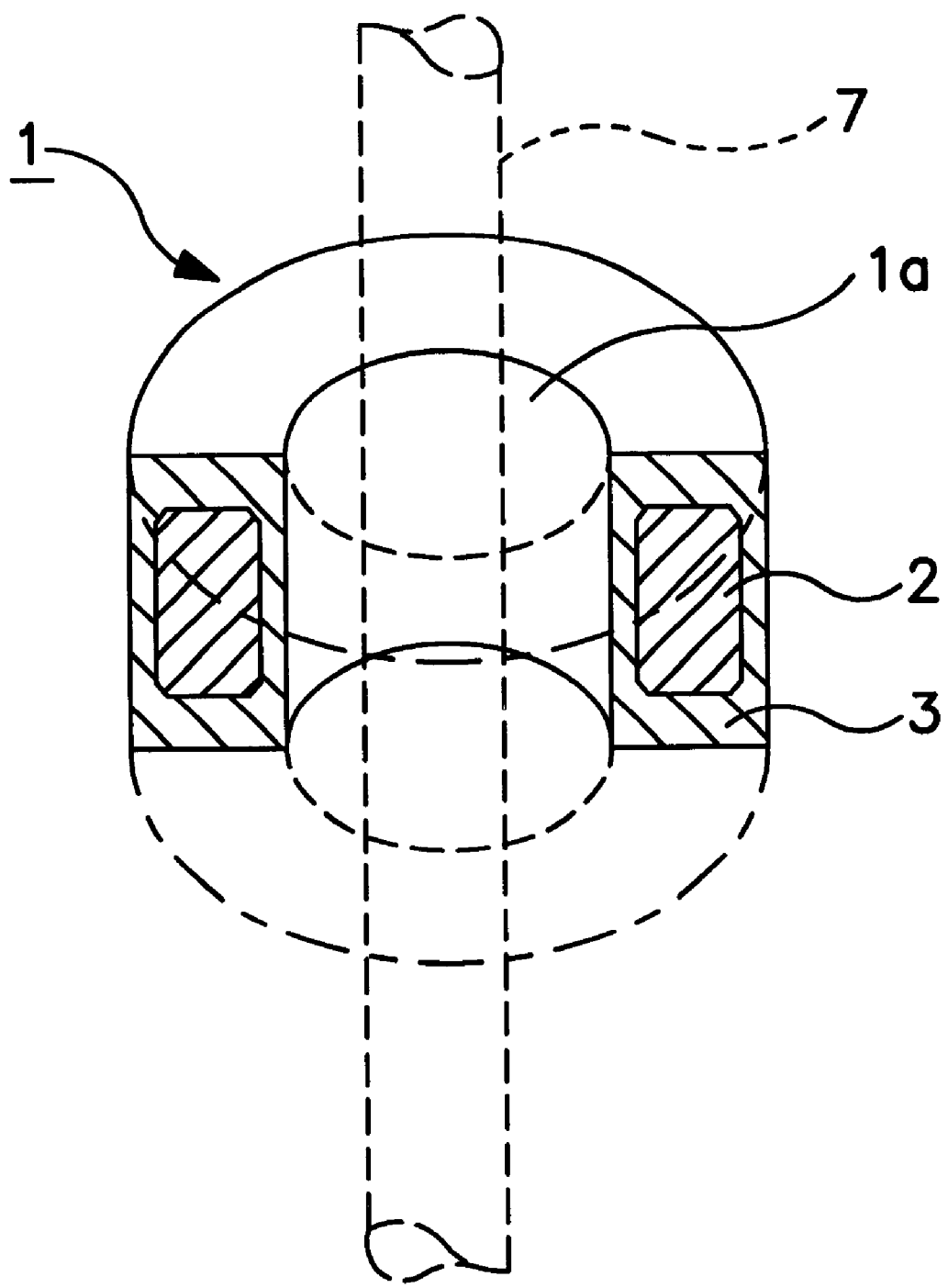
FIG. 1 is a cross-sectional perspective view of an exemplary noise-suppressing component according to a first embodiment of the present invention.

Exemplary embodiments of a noise-suppressing component according to the present invention will be described below by referring to the drawings.

FIG. 1 shows a noise-suppressing component 1 according to a first embodiment of the present invention. It includes a ring-shaped ceramic core 2 and an insulating member 3 with magnetic powder which covers the surface of the ring-shaped ceramic core 2. The ring-shaped ceramic core 2 has a circular horizontal cross section. Ceramic ferrite having an initial magnetic permeability of approximately 50 to 1500, for example, is used for the ring-shaped ceramic core 2. For instance, in the one specific exemplary embodiment, Ni—Zn ceramic ferrite having an initial magnetic permeability of about 450 is used.

Resin including magnetic powder which has an initial magnetic permeability of 2 to 50 or rubber including the magnetic powder is used for the insulating member 3. Since resin and rubber are flexible, they can also function as a damping member against mechanical stress applied to the ring-shaped ceramic core 2. The insulating member 3 having the magnetic powder covers the surface of the ring-shaped ceramic core 2. Therefore, the insulation coating of a signal line 7 inserted into the hole 1a of the noise-suppressing component 1 does not directly rub against the surface of the ring-shaped ceramic core 2, and the line is unlikely to be damaged for this reason. In one exemplary embodiment, resin having magnetic powder which has an initial magnetic permeability of 14.5 is used. The resin having the magnetic powder is made by kneading resin with powdered ceramic ferrite having an initial magnetic permeability of about 200. Alternatively, another resin having magnetic powder which has an initial magnetic permeability of 17.5 can also be used. This resin having the magnetic powder is made by kneading resin with powdered ceramic ferrite having an initial magnetic permeability of about 450.

The reason why the initial magnetic permeability of the ring-shaped ceramic core 2 is set to approximately 50 or more is that, if the initial magnetic permeability becomes lower than approximately 50, the frequency where the magnetic loss appears shifts too much towards the high-frequency side to obtain a noise-suppressing effect in a wide frequency range. The reason why the initial magnetic permeability of the ring-shaped ceramic core 2 is set to approximately 1500 or less is that, the initial magnetic permeability of the insulating member 3 having the magnetic powder is usually approximately 50, and if the initial magnetic permeability of the ring-shaped ceramic core 2 exceeds approximately 1500, the characteristics of the ring-shaped ceramic core 2 become too strong to obtain an effect by the insulating member 3 having the magnetic powder. On the other hand, the reason why the initial magnetic permeability of the insulating member 3 having the magnetic powder is set to approximately 50 or less is that it is difficult to produce an insulating member 3 having magnetic powder which has an initial magnetic permeability exceeding approximately 50, and if the initial magnetic permeability exceeds approximately 50, the characteristics of the insulating member 3 having the magnetic powder become too close to those of the ring-shaped ceramic core 2 to obtain an advantage of providing the insulating member 3 having the magnetic powder.

An insulating member 3 having magnetic powder is used in which the magnetic powder has an average particle diameter of approximately 1 to 100 μm and the magnetic-powder content is approximately 20 to 70 percent by volume. This is because, if the magnetic powder has an average particle diameter of more than approximately 100 μm, it is difficult to knead the powder with resin or rubber, and if the magnetic powder has an average particle diameter of less than approximately 1 μm, a required magnetic permeability cannot be obtained. This is also because, if the magnetic-powder content becomes less than approximately 20 percent by volume, a required magnetic permeability cannot be obtained. Also, it is preferred that the insulating member 3 have a magnetic-powder content of approximately 20 to 70 percent by volume to integrally form the insulating member 3 on the ring-shaped ceramic core 2 by cast molding or injection molding. However, the manufacturing method for forming the insulating member 3 on the ring-shaped ceramic core 2 is not limited to cast molding or injection molding.

Figure 2:
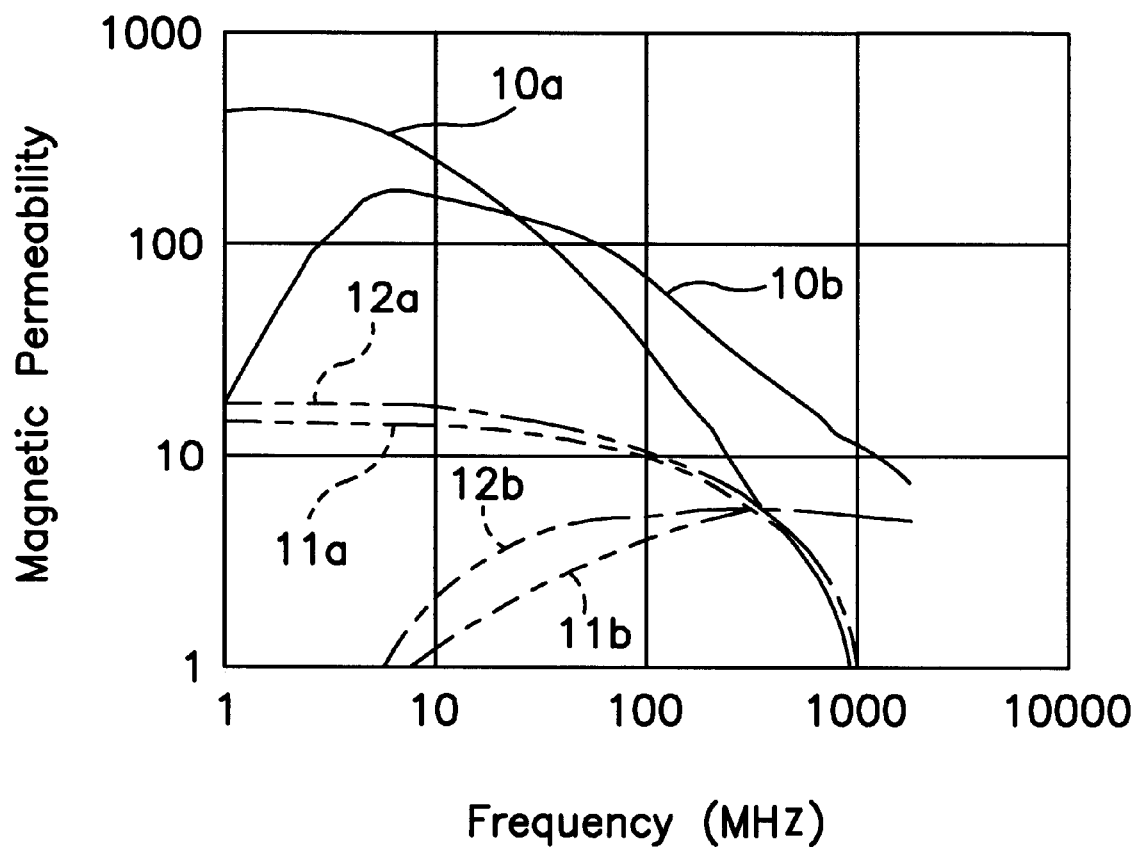
FIG. 2 is a graph showing the relationship between the magnetic permeability and the frequency of both the ring-shaped ceramic cores and insulating members.

FIG. 2 shows the relationship (indicated by a one-dot chain line 11a) between the magnetic permeability and the frequency of the insulating member 3 which includes the magnetic powder having an initial magnetic permeability of 14.5 and the relationship (indicated by a dotted line 12a) between the magnetic permeability and the frequency of the insulating member 3 which includes the magnetic powder having an initial magnetic permeability of 17.5. These relationships largely differ from the relationship (indicated by a solid line 10a) between the magnetic permeability and the frequency of the ring-shaped ceramic core 2. The dotted line 11b shows the relationship between the magnetic loss and the frequency of the insulating member 3 which includes the magnetic powder having an initial magnetic permeability of 14.5, and the dotted line 12b shows the relationship between the magnetic loss and the frequency of the insulating member 3 which includes the magnetic powder having an initial magnetic permeability of 17.5.

From these relationships, it can be seen that the magnetic loss increases at a frequency positioned slightly in the high-frequency side of the frequency range in which the magnetic loss (indicated by a solid line 10b) of the ring-shaped ceramic core 2 increases. The insulating members 3 including the magnetic powder have a resistance due to the magnetic loss, which increases only in a high-frequency range. It is understood from a comparison between the magnetic-loss characteristics (indicated by the one-dot chain line 11b) of the insulating member 3 which includes the magnetic powder having an initial magnetic permeability of 14.5 and the characteristics (indicated by the dotted line 12b) of the insulating member 3 which includes the magnetic powder having an initial magnetic permeability of 17.5 that the insulating member 3 (indicated by the one-dot chain line 11b in FIG. 2) which includes the magnetic powder having a lower initial magnetic permeability shows an increase of magnetic loss at a higher frequency.

In the noise-suppressing component 1 having the above structure, the initial magnetic permeability of the ring-shaped ceramic core 2 is selected in the range from approximately 50 to 1500 to obtain various resistance characteristics in a low-frequency region. Since this ring-shaped ceramic core 2 is integrally formed with the insulating member 3 which includes the magnetic powder having an initial magnetic permeability of approximately 2 to 50, the insulating member 3 having the magnetic powder compensates for a reduction in resistance due to a reduction of the magnetic loss of the ring-shaped ceramic core in a high-frequency region to implement a component having a great noise-suppressing effect in a wide frequency range.

Figure 3:
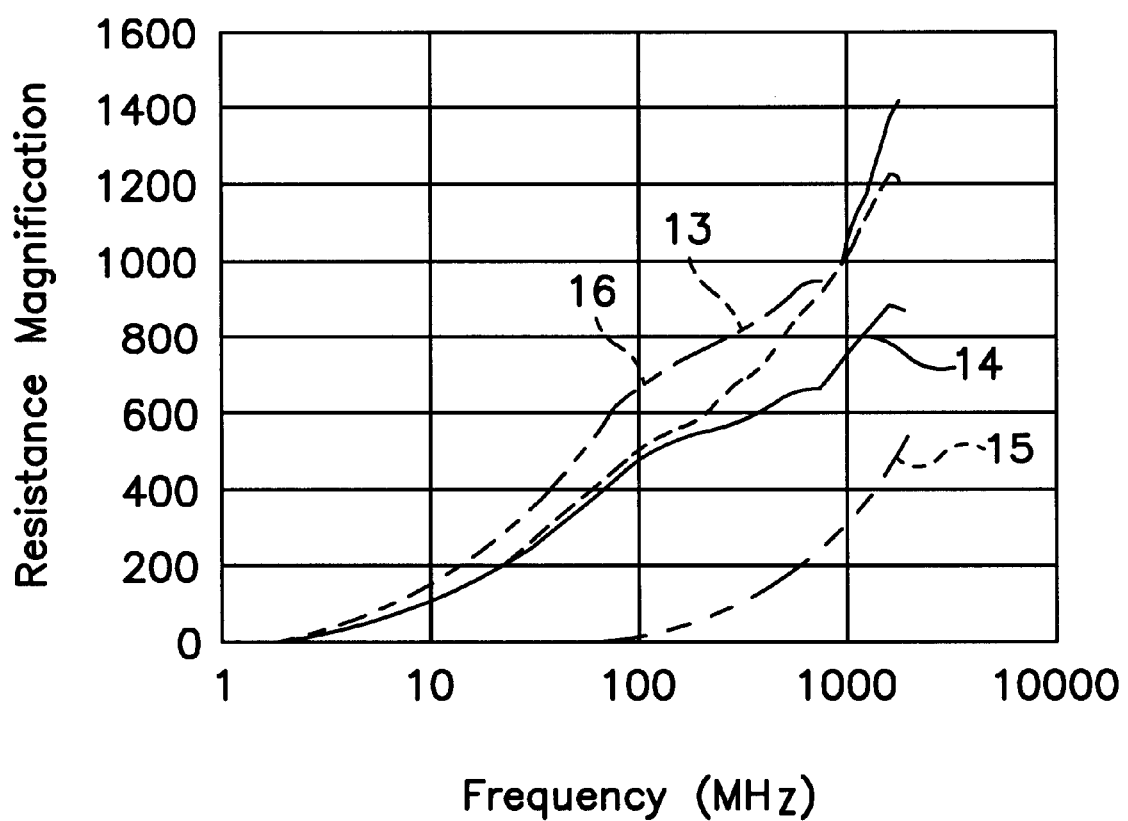
FIG. 3 is a graph showing the relationship between the resistance magnification and the frequency of each of the ring-shaped ceramic cores.

More specifically, the resistance loss component of an exemplary noise-suppressing component 1 was measured. This component comprised a ring-shaped ceramic core 2 formed of ceramic ferrite having an initial magnetic permeability of about 450, which was integrally formed with an insulating member 3 which includes magnetic powder having an initial magnetic permeability of 14.5. The measurement result is indicated by a dotted line 13 in FIG. 3 as a relative resistance magnification in which the resistance of the ceramic ferrite at 1 MHz is set to 1. For comparison, a solid line 14 indicates the resistance magnification of a noise-suppressing component (hereinafter called a comparison example 1) formed only of a ring-shaped ceramic core made from ceramic ferrite having an initial magnetic permeability of about 450, and a two-dot chain line 15 indicates the resistance magnification of a noise-suppressing component (hereinafter called a comparison example 2) formed of resin in a ring shape which includes magnetic powder having an initial magnetic permeability of 14.5. As indicated by the solid line 14, in the comparison example 1 formed of the ring-shaped ceramic core only, the resistance starts increasing at about 10 MHz and the rate of increase starts declining at more than 100 MHz. In the comparison example 2 formed of the resin having the magnetic powder, as indicated by the two-dot chain line 15, the resistance starts increasing at 100 MHz or more. On the other hand, as indicated by the dotted line 13, in the noise-suppressing component 1 formed of a combination of the ring-shaped ceramic core 2 and the insulating member 3 having the magnetic powder, the resistance starts increasing at about 10 MHz and a high rate of increase continues even in a high-frequency range of 100 MHz or more.

To obtain substantially the same resistance as the noise-suppressing component 1 formed of the combination of the ring-shaped ceramic core 2 and the insulating member 3 having the magnetic powder, by the comparison example 1 formed of the ring-shaped ceramic core only, in a high-frequency range of 800 MHz or more, it is necessary to extend the cross-sectional area of the ring-shaped magnetic core about 1.4 times. The resistance magnification of a noise-suppressing component in which the cross-sectional area of the ring-shaped ceramic core is extended about 1.4 times is indicated by a one-dot chain line 16 in FIG. 3. In this modified noise-suppressing component, the resistance in a low-frequency range also increases and a normal signal waveform is distorted, as indicated by the one-dot chain line 16.

When the signal line 7 is inserted into the hole 1a provided at the center of the noise-suppressing component 1 as shown in FIG. 1, the noise-suppressing component 1 suppresses wide frequency band noise ranging from the MHz band to the GHz band which is traveling through the signal line 7.

Figure 4:
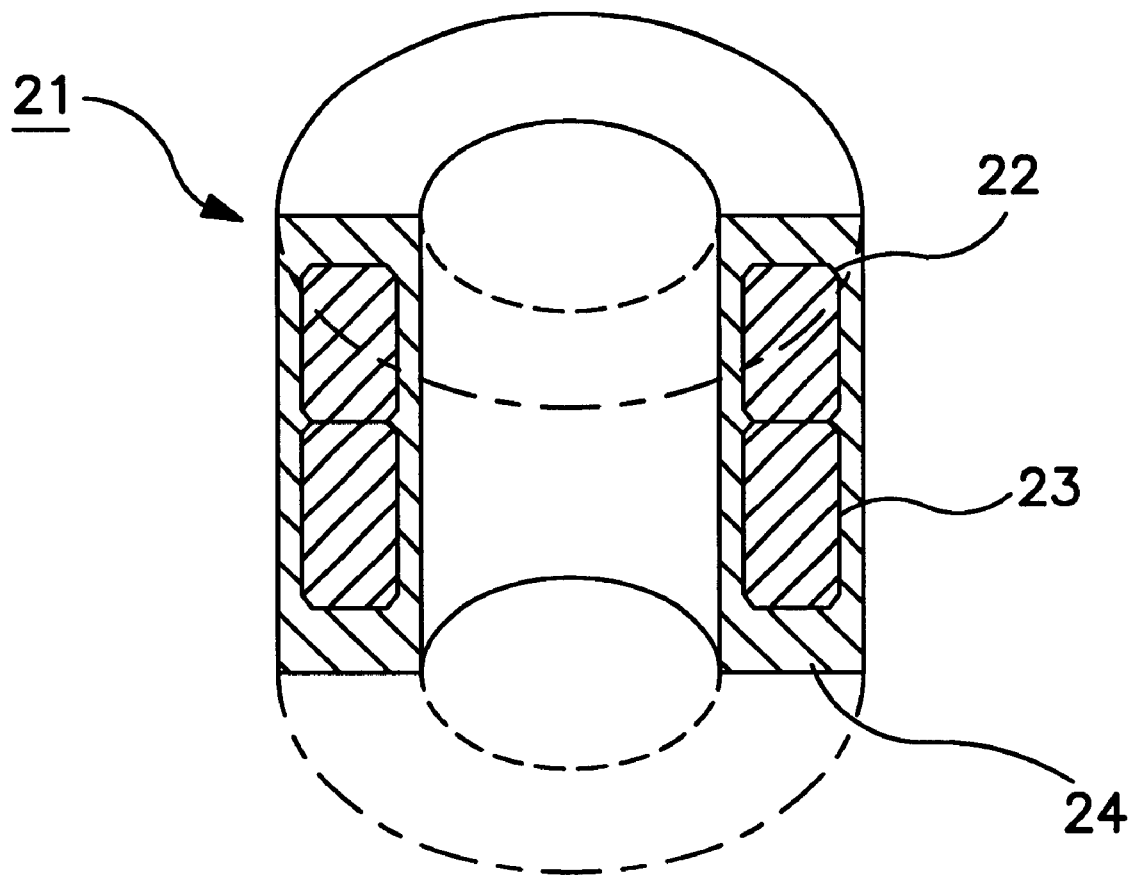
FIG. 4 is a cross-sectional perspective view of an exemplary noise-suppressing component according to a second embodiment of the present invention.

FIG. 4 shows a noise-suppressing component 21 according to a second embodiment of the present invention. It is formed by coating two ring-shaped ceramic cores 22 and 23 having substantially the same shape and different magnetic permeabilities and being arranged next to each other vertically (e.g., stacked on top of each other), with an insulating member 24 including magnetic powder.

Figure 5:
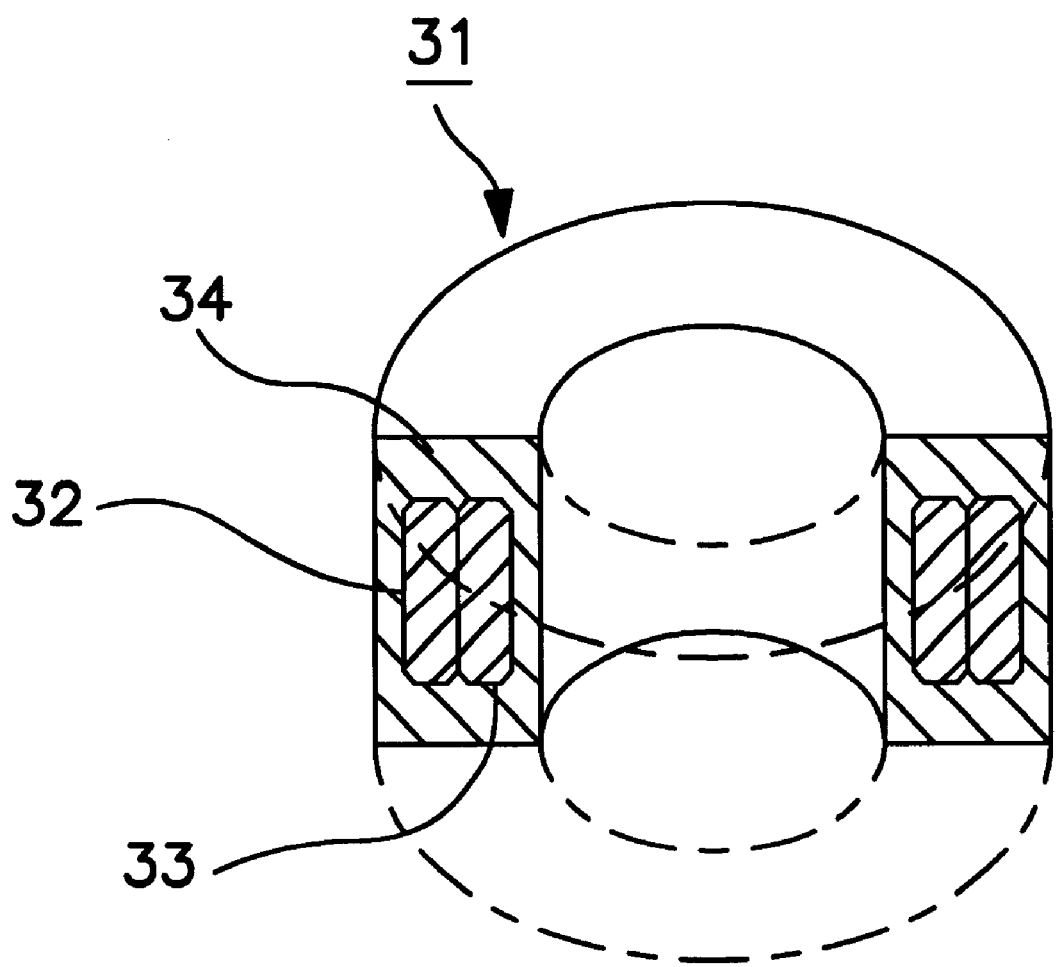
FIG. 5 is a cross-sectional perspective view of an exemplary noise-suppressing component according to a third embodiment of the present invention.

FIG. 5 shows a noise-suppressing component 31 according to a third embodiment of the present invention. It is formed by coating two ring-shaped ceramic cores 32 and 33 having different magnetic permeabilities and different diameters and being disposed concentrically, with an insulating member 34 including magnetic powder. That is, the ceramic core 33 is located radially inward from the ceramic core 32.

Figure 6:
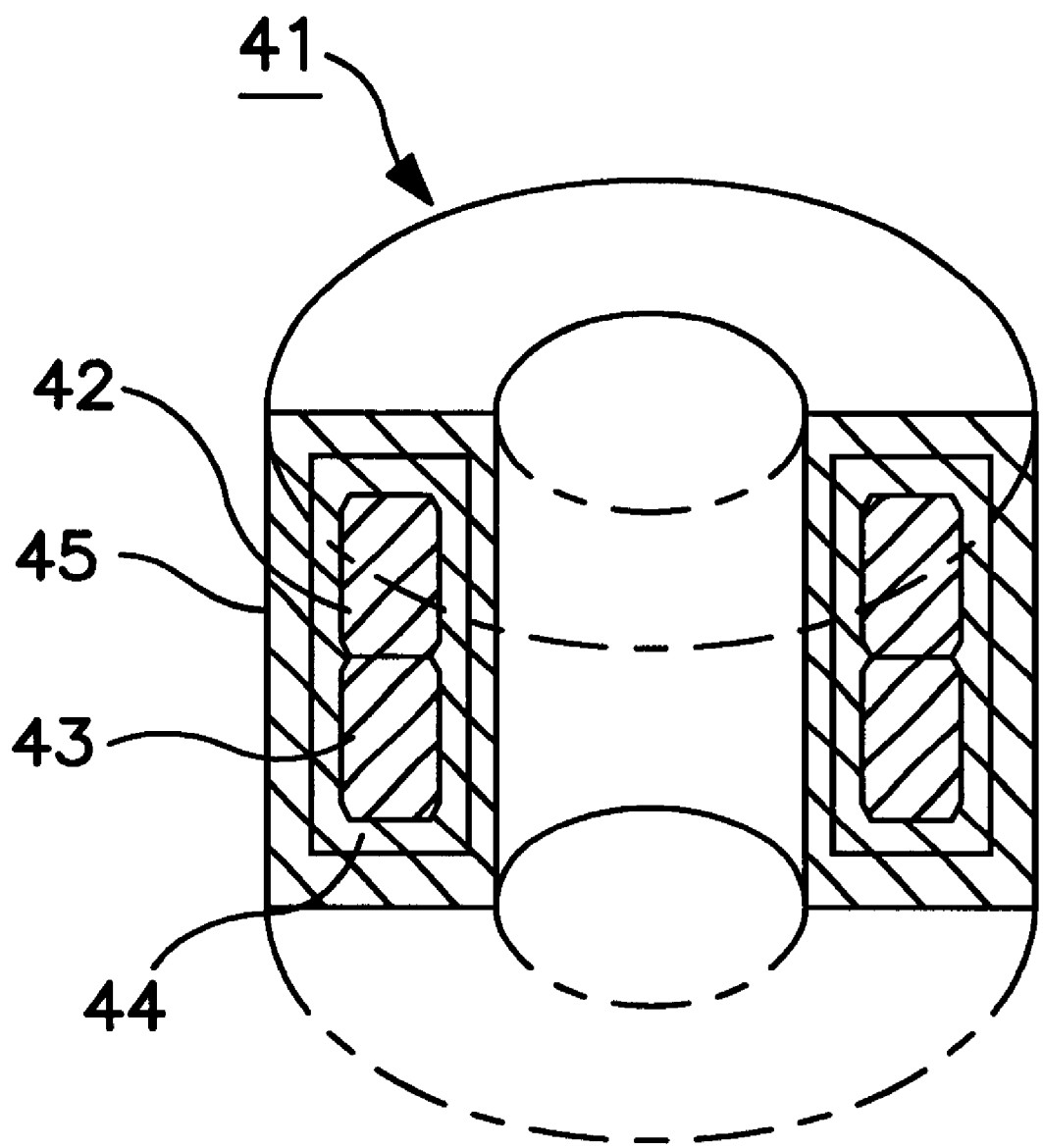
FIG. 6 is a cross-sectional perspective view of an exemplary noise-suppressing component according to a fourth embodiment of the present invention.

FIG. 6 shows a noise-suppressing component 41 according to a fourth embodiment of the present invention. It is formed by double-coating two ring-shaped ceramic cores 42 and 43 having substantially the same shape and different magnetic permeabilities and being arranged next to each other vertically. The insulating members 44 and 45 including magnetic powders having different magnetic permeabilities.

As described above, with the use of a plurality of ring-shaped ceramic cores having different magnetic permeabilities and insulating members including magnetic powder, noise-suppressing characteristics can be further improved in a wide frequency range.

A noise-suppressing component according to the present invention is not limited to the above embodiments. It can be modified in various ways within the scope of the invention. For instance, the ring-shaped ceramic core may have a rectangular cross section, instead of a circular cross section.

Generally, the above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A noise-suppressing component comprising:
   a ceramic core having an initial magnetic permeability of approximately 50 to 1500; and
   an insulating member integrally formed with said ceramic core, wherein said insulating member includes a magnetic additive and has an initial magnetic permeability of approximately 2 to 50.

2. The noise-suppressing component of claim 1, wherein said ceramic core is made of ferrite.

3. The noise-suppressing component of claim 1, wherein said ceramic core is shaped in a ring.

4. The noise-suppressing component of claim 1, wherein said ceramic core comprises at least a first and second concentrically arranged ring-shaped ceramic cores.

5. The noise-suppressing component of claim 4, wherein said first ceramic core has a different magnetic permeability than said second ceramic core.

6. The noise-suppressing component of claim 4, wherein said first ceramic core is stacked on top of said second ceramic core.

7. The noise-suppressing component of claim 4, wherein said first ceramic core is located radially inward from said second ceramic core.

8. The noise-suppressing component of claim 1, wherein said insulating member is made from rubber or resin.

9. The noise-suppressing component of claim 1, wherein said magnetic additive comprises a magnetic powder having particles with an average particle size of approximately 1 to 100 $\mu$m.

10. The noise-suppressing component of claim 1, wherein said insulating member has a magnetic-additive content of approximately 20 to 70 percent by volume.

11. The noise-suppressing component of claim 1, wherein said insulating member coats at least portions of the surface of said ceramic core.

12. The noise-suppressing component of claim 11, wherein said insulating member comprises a first layer which coats said ceramic core, and a second layer disposed over said first layer.

13. The noise-suppressing component of claim 12, wherein said first layer has a magnetic permeability different than said second layer.

14. The noise-suppressing component of claim 12, wherein said ceramic core includes a first core and a second core, wherein said first core has a different magnetic permeability than said second core.

15. The noise-suppressing component of claim 1, wherein the ceramic core has an initial permeability of 450, and the magnetic additive has an initial magnetic permeability of 14.5.

16. A noise-suppressing component comprising:
   a ring-shaped ceramic core having a central opening for receiving a signal line, having an initial magnetic permeability of approximately 50 to 1500;
   an insulating member disposed over the surface of said ring-shaped ceramic core and integrally formed with said ceramic core, wherein said insulating member includes magnetic powder and has an initial magnetic permeability of approximately 2 to 50.

17. The noise-suppressing component of claim 16, wherein said ceramic core comprises concentrically arranged first and second-ceramic cores having different magnetic permeabilities.

18. The noise-suppressing component of claim 16, wherein said insulating member is made from rubber or resin.

19. The noise-suppressing component of claim 16, wherein said magnetic powder comprises particles with an average particle size of approximately 1 to 100 µm.

20. The noise-suppressing component of claim 16, wherein said insulating member has a magnetic-powder content of approximately 20 to 70 percent by volume.

21. The noise-suppressing component of claim 16, wherein said insulating member comprises a first layer which coats said ceramic core, and a second layer disposed over said first layer.

22. The noise-suppressing component of claim 16, wherein the ceramic core has an initial permeability of 450, and the magnetic powder has an initial magnetic permeability of 14.5.

23. The noise-suppressing component of claim 22,
   wherein said insulating member is made from rubber or resin;
   wherein said magnetic powder comprises particles with an average particle size of approximately 1 to 100 µm; and
   wherein said insulating member has a magnetic-powder content of approximately 20 to 70 percent by volume.

* * * * *